(12) United States Patent
Kahlert et al.

(10) Patent No.: US 7,384,877 B2
(45) Date of Patent: Jun. 10, 2008

(54) TECHNIQUE FOR REDUCING SILICIDE DEFECTS BY REDUCING DELETERIOUS EFFECTS OF PARTICLE BOMBARDMENT PRIOR TO SILICIDATION

(75) Inventors: Volker Kahlert, Dresden (DE); Christof Streck, Coswig (DE); Patrick Press, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/419,540

(22) Filed: May 22, 2006

(65) Prior Publication Data

US 2007/0045226 A1  Mar. 1, 2007

(30) Foreign Application Priority Data

Aug. 31, 2005 (DE) .................. 10 2005 041 310

(51) Int. Cl.
*H01L 21/302* (2006.01)

(52) U.S. Cl. .............. 438/755; 438/655; 438/657; 438/710; 438/745

(58) Field of Classification Search ............ 438/655, 438/657, 659, 710, 712, 720, 706, 745, 755
See application file for complete search history.

(56) References Cited

U.S. PATENT DOCUMENTS

| | | | |
|---|---|---|---|
| 6,025,267 A | 2/2000 | Pey et al. | |
| 6,221,767 B1 * | 4/2001 | Hsu et al. | 438/658 |
| 6,548,421 B1 | 4/2003 | Hamanaka et al. | |
| 6,821,860 B1 * | 11/2004 | Behammer | 438/381 |
| 6,864,183 B2 * | 3/2005 | Maekawa | 438/710 |
| 2002/0142616 A1 | 10/2002 | Giewont et al. | |
| 2003/0203606 A1 | 10/2003 | Maekawa | |

OTHER PUBLICATIONS

Nam-Sik Kim, et al. "Void Formation During Silicidation and its Influence on the Thermal Stability of Cobalt Silicide" J. Vac. Sci. Technol A. 20(4), Jul./Aug. 2002.

* cited by examiner

*Primary Examiner*—Lan Vinh
(74) *Attorney, Agent, or Firm*—Williams, Morgan & Amerson, P.C.

(57) ABSTRACT

By reducing the effect of particle bombardment during the sequence for forming a metal silicide in semiconductor devices, the defect rate and the metal silicide uniformity may be enhanced. For this purpose, the metal may be deposited without an immediately preceding sputter etch process, wherein, in a particular embodiment, an additional oxidation process is performed to efficiently remove any silicon contaminations and surface impurities by a subsequent wet chemical treatment on the basis of HF, which is followed by the metal deposition.

21 Claims, 6 Drawing Sheets

TECHNIQUE FOR REDUCING SILICIDE DEFECTS BY REDUCING DELETERIOUS EFFECTS OF PARTICLE BOMBARDMENT PRIOR TO SILICIDATION

BACKGROUND OF THE INVENTION

1. Field of the Invention

Generally, the present invention relates to the field of fabrication of integrated circuits, and, more particularly, to semiconductor devices having metal silicide portions on semiconductor regions to reduce the resistance of the semiconductor regions.

2. Description of the Related Art

In modern ultra-high density integrated circuits, device features are steadily decreasing to enhance device performance and functionality. Shrinking the feature sizes, however, entails certain problems that may partially offset the advantages obtained by the reduced feature sizes. Generally, reducing the feature sizes of, for example, a transistor element may lead to a decreased channel resistance in the transistor element and thus result in a higher drive current capability and enhanced switching speed of the transistor. In decreasing the features sizes of these transistor elements, however, the increasing electrical resistance of conductive lines and contact regions, i.e., of regions that connect transistor areas, such as drain and source regions, with the periphery of the transistor element, becomes a dominant issue, since the cross-sectional area of these lines and regions decreases with decreasing feature sizes. The cross-sectional area, however, determines, in combination with the characteristics of the material comprising the conductive lines and contact regions, the resistance thereof.

The above problems may be exemplified for a typical critical feature size in this respect, also referred to as a critical dimension (CD), such as the extension of the channel of a field effect transistor that forms below a gate electrode between a source region and a drain region of the transistor. Reducing this extension of the channel, commonly referred to as channel length, may significantly improve device performance with respect to fall and rise times, when operating the transistor element in a switched mode, due to the smaller capacitance between the gate electrode and the channel and due to the decreased resistance of the shorter channel. Shrinking of the channel length, however, also entails the reduction in size of any conductive lines, such as the gate electrode of the field effect transistor, which is commonly formed of polysilicon, and the contact regions that allow electrical contact to the drain and source regions of the transistor, so that consequently the available cross-section for charge carrier transportation is reduced. As a result, the conductive lines and contact regions exhibit a higher resistance unless the reduced cross-section is compensated for by improving the electrical characteristics of the material forming the lines and contact regions, such as the gate electrode, and the drain and source contact regions.

It is thus of particular importance to improve the characteristics of conductive regions that are substantially comprised of semiconductor material such as silicon. For instance, in modern integrated circuits, the individual semiconductor devices, such as field effect transistors, capacitors and the like, are primarily based on silicon, wherein the individual devices are connected by silicon lines and metal lines. While the resistivity of the metal lines may be improved by replacing the commonly used aluminum by, for example, copper and copper alloys, process engineers are confronted with a challenging task when an improvement in the electrical characteristics of silicon-containing semiconductor lines and semiconductor contact regions is required.

With reference to FIGS. 1a-1d, an exemplary process for manufacturing an integrated circuit containing, for example, a plurality of MOS transistors will now be described in order to illustrate the problems involved in improving the electrical characteristics of silicon-containing semiconductor regions in more detail.

In FIG. 1a, a semiconductor device 100, which may represent a MOS transistor, comprises a substrate 101, such as a bulk silicon substrate, a silicon-on-insulator (SOI) substrate, or any other appropriate carrier material on which is formed a silicon-containing semiconductor layer. For convenience, in FIG. 1a, the substrate 101 is to be considered as having formed thereon an appropriate silicon-containing layer, in which are formed drain and source regions 107 including appropriate extension regions 107e. As will be explained in the following, the drain and source regions 107 are to receive a metal silicide region therein so as to enhance the conductivity of the drain and source regions 107. Located between the drain and source regions 107 and the respective extension regions 107e is a channel region 102, above which is located a gate electrode 103, which may be comprised of polysilicon. The gate electrode 103 may also receive a metal silicide region thereon to reduce the resistivity. The gate electrode 103 is separated from the channel region 102 by an appropriate gate insulation layer 104, which may be comprised of, for instance, silicon dioxide, silicon nitride, or any other appropriate material composition. Moreover, spacer elements 106 including appropriate etch stop layers or liners 105 are formed at sidewalls of the gate electrode 103, wherein it should be appreciated that the spacers 106 and the etch stop layers 105 may represent two or more individual spacer elements and corresponding etch stop layers that may have been used during the formation of the semiconductor device 100 as shown in FIG. 1a. Finally, a protective layer 108 is formed above the substrate 101 to cover exposed portions of the semiconductor device 100, such as the gate electrode 103 including the spacers 106 and surface portions of the drain and source regions 107.

A typical process flow for forming the conventional semiconductor device 100 as shown in FIG. 1a may comprise the following processes. After the formation of appropriate active regions in the substrate 101, i.e., within a corresponding silicon-containing crystal-line layer, an appropriate vertical dopant profile may be established within the respective active regions by well-established isolation techniques, such as trench isolation techniques and the like, so as to allow the formation of transistor elements, capacitors and the like. For convenience, any such isolation structure and dopant profile is not shown in FIG. 1a. Thereafter, the gate insulation layer 104 may be formed by appropriate oxidation and/or deposition techniques, during which an insulating layer having a desired thickness and material composition is formed on the surface of the semiconductor device 100. As previously discussed, in modern integrated circuits, critical dimensions of circuit features, such as the gate length of MOS transistors, i.e., in FIG. 1a, the horizontal extension of the gate electrode 103, have reached 100 nm and significantly less. Hence, due to the reduced gate length, the cross-sectional area of the gate electrode 103 is also significantly reduced, thereby requiring an efficient technique for increasing the conductivity of the material in the gate electrode 103, which is typically accomplished by forming a metal silicide therein.

Thereafter, a gate electrode material, i.e., polysilicon, may be deposited by well-established low pressure chemical vapor deposition (LPCVD) followed by well-established photolithography techniques to pattern the gate electrode material, thereby forming the gate electrode 103 and the gate insulation layer 104, as shown in FIG. 1*a*. Next, the extension regions 107*e* and the drain and source regions 107 may be formed by a sequence of implantation processes, wherein the gate electrode 103 and any appropriate sidewall spacers may be used as an implantation mask. For instance, the spacers 106 may represent the entire spacer structure so as to obtain a laterally profiled dopant concentration as is required for the drain and source regions 107 and the extension regions 107*e*. Thereafter, or intermittently during the implantation sequence, appropriate anneal processes may be performed to activate the dopants and to substantially re-crystallize any crystalline defects caused by the preceding implantation. Next, the silicon dioxide layer 108 may be formed, for instance, by well-established chemical vapor deposition (CVD) techniques on the basis of TEOS or silane with a thickness of approximately 10-50 nm to appropriately protect the device 100 during the handling and processing for preparing the device 100 for the formation of metal silicide regions in the gate electrode 103 and the drain and source regions 107. That is, after the formation of the silicon dioxide layer 108, the device 100 may be conveyed to a corresponding silicidation module, in which further process steps for the formation of metal silicide regions may be performed.

Consequently, the semiconductor device 100 is subjected to a cleaning and removal process 109, wherein, in a first step, appropriate cleaning processes are performed to substantially remove any particles and metals from the silicon dioxide layer 108. Thereafter, the oxide layer 108 is removed by a wet chemical etch process on the basis of hydrofluoric acid (HF), wherein, in accordance with well-established process recipes, process parameters, such as temperature, concentration of the hydrofluoric acid, reaction time and the like, are adjusted to leave a significant portion of Si—H bonds on exposed silicon-containing surface portions, such as on the gate electrode 103 and the drain and source regions 107. Without intending to restrict the present application to the following explanation, it is believed that the Si—H surface is highly advantageous for the subsequent actual silicidation process to promote the chemical reaction between an appropriate metal to be deposited and the Si—H bonding containing surface portions.

FIG. 1*b* schematically shows the semiconductor device 100 after the cleaning and removal process 109, wherein the silicon dioxide layer 108 is removed. Moreover, the device 100 is subjected to a further cleaning and activation process 110, in which a sputter etch process is performed in an appropriate sputter deposition tool prior to the metal deposition process, thereby removing further contaminants from the exposed surface portions and also making the exposed silicon surface reactive with respect to the metal that is subsequently to be deposited. The corresponding surface portions activated by the particle bombardment in the sputter etch process 110 are indicated as 111. Thereafter, the process parameters of the process 110 are appropriately changed to initiate the deposition of an appropriate refractory metal, such as cobalt, nickel and the like, on the activated surface portions 111 and also on the insulating portions of the spacers 106.

FIG. 1*c* schematically shows the semiconductor device 100 with a correspondingly formed metal layer 112. After the deposition of the metal layer 112, the semiconductor device 100 may be subjected to a heat treatment to initiate diffusion of metal from the layer 112 into the activated portions 111, as is indicated by the corresponding arrows. Depending on the type of metal used, the temperature and the duration of the heat treatment may be selected so as to form a desired amount of metal silicide in the gate electrode 103 and the drain and source regions 107. For example, during the formation of a cobalt silicide, a first heat treatment may be performed at temperatures of approximately 500-600° C., thereby creating substantially cobalt monosilicide, which, however, typically exhibits a moderate high electrical resistance. After the first heat treatment, a second heat treatment at a lower temperature may be performed to convert a significant amount of cobalt monosilicide into a cobalt disilicide, which exhibits a desired low electric resistance. During the first and second heating steps or after the second heating step, an appropriately designed selective etch process may be performed to remove any non-reacted metal of the layer 112. It should be appreciated that other process schemes may be used, depending on the metal used and other process and device specific requirements. For instance, during the formation of a nickel silicide, the process parameters may be selected so as to substantially suppress the formation of nickel disilicide, since nickel disilicide exhibits a significantly higher electrical resistance compared to nickel monosilicide. Thereafter, appropriate heating steps may be performed to thermally stabilize the respective metal silicide formed in the gate electrode 103 and the drain and source regions 107.

FIG. 1*d* schematically shows the semiconductor device 100 after the completion of the above-described silicidation process so that corresponding metal silicide regions 114 are formed in the drain and source regions 107 and in the gate electrode 103. Although the metal silicide regions 114 may significantly enhance the conductivity of the respective regions, a number of difficulties may arise with the above-described conventional process sequence, in particular when extremely scaled semiconductor devices are considered, in which any non-uniformities of the metal silicide regions 114, as well as any defects, may considerably affect the overall behavior of the device 100. For example, silicide defects 114*b* may be observed on insulating areas, such as the sidewall spacers 106, which may be difficult to be removed and which may possibly provide a conductive path between actually isolated device regions. Moreover, regions 114*a* may be observed within the metal silicide regions 114, in which a reduced amount of metal silicide or no silicide at all has been formed during the preceding silicidation process, thereby rendering the corresponding metal silicide 114 highly non-uniform with respect to its current drive capability. Consequently, especially for highly scaled semiconductor devices, the area 114*a* may significantly degrade the overall performance of the semiconductor device 100.

In view of the situation described above, there exists a need for an improved technique that enables the formation of metal silicide regions while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique for the formation of metal silicide regions in a semiconductor device, even in highly scaled transistor elements, wherein the defect rate and/or the uniformity of the individual metal silicide regions may be significantly improved. For this purpose, a process sequence is provided in which surface contaminations, which may influence the defect rate and/or the diffusion behavior of the metal, may be removed more efficiently, while at the same time the influence of a particle bombardment, which is believed to have an influence on the defect rate and/or diffusion behavior, may be reduced.

According to one illustrative embodiment of the present invention, a method comprises treating a surface region of a semiconductor structure including a conductive silicon-containing surface portion by a particle bombardment. Moreover, the treated surface region is exposed to an oxidizing ambient to thereby form oxidized portions on the treated surface region. Furthermore, a metal layer is formed on the surface region and, finally, the formation of a metal silicide is initiated in the conductive silicon-containing surface portion.

According to another illustrative embodiment of the present invention, a method comprises performing a silicidation pretreatment for cleaning and activating a silicon-containing region of at least one of a gate electrode, a source region and a drain region, wherein the silicidation pretreatment comprises a wet chemical treatment as a last reactive process prior to a silicidation process. Moreover, a metal layer is deposited on the pretreated silicon-containing region and a metal silicide is formed in the silicon-containing region on the basis of the metal layer.

BRIEF DESCRIPTION OF THE DRAWINGS

The invention may be understood by reference to the following description taken in conjunction with the accompanying drawings, in which like reference numerals identify like elements, and in which.

Figure 1A:
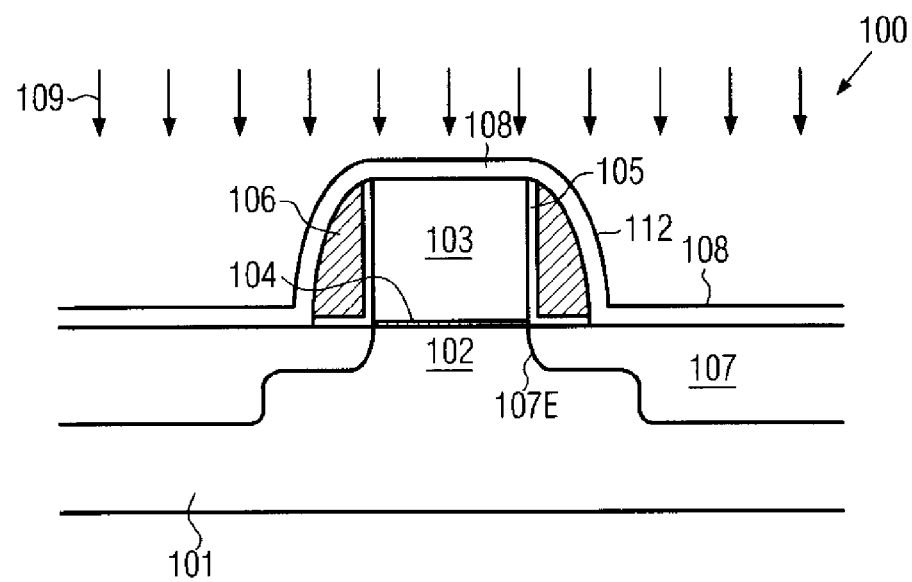
FIGS. 1a-1d schematically show cross-sectional views of a conventional semiconductor device during various manufacturing stages in accordance with a conventional process flow for forming metal silicide regions in a gate electrode and drain and source regions of a transistor element.
Figure 1B:
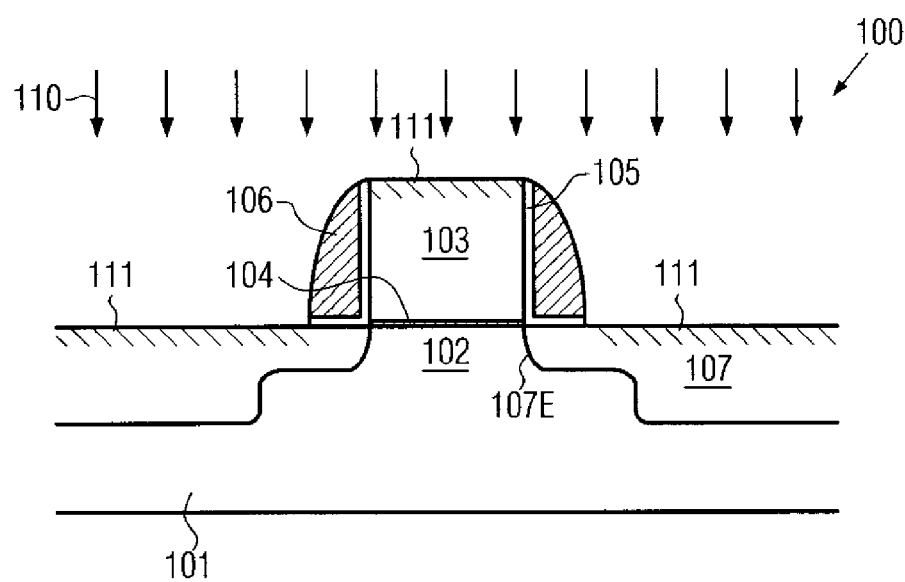

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1C:
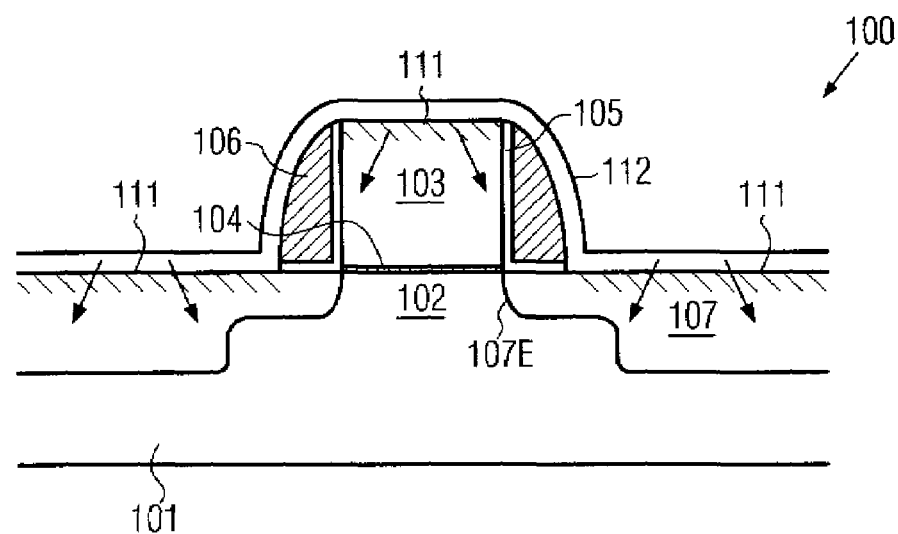
Figure 1D:
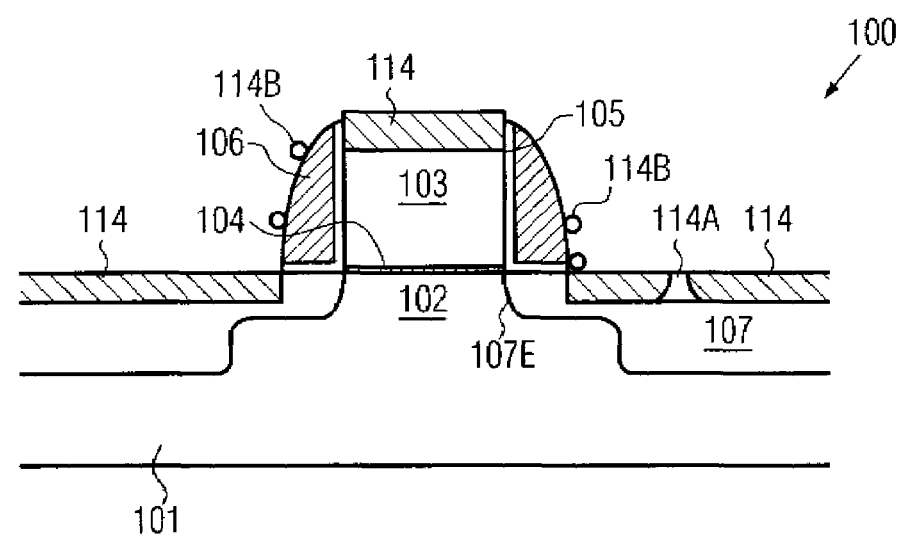

Generally, the present invention contemplates a technique for forming metal silicide regions, such as nickel silicide regions, cobalt silicide regions and the like, on circuit elements of integrated circuits, in particular in highly scaled integrated circuits having critical dimensions of 100 nm and even significantly less, in that the defect rate, as well as non-uniformities of the metal silicide regions, such as "missing silicide defects," are significantly reduced by considering the influence of a particle bombardment for surface activation on the entire process. Without intending to restrict the present invention to the following explanation, it is believed that the sputter etch process used in the conventional process sequence immediately before the actual metal deposition may have a significant influence on the defect rate and the diffusion behavior during the actual silicidation process. For example, during the in situ sputter etch process prior to the metal deposition, silicon may be sputtered off from exposed surface portions and may be re-deposited, at least partially, on non-desired locations, including insulating surfaces, such as the surface of sidewall spacers, isolation structures and the like. During the subsequent metal deposition and silicidation, these non-desired silicon contaminants may also be converted into metal silicide, thereby creating a high defect rate, as is previously discussed with reference to FIG. 1d. Moreover, it is assumed that the activation of certain impurities incorporated in the silicon-containing surface areas may result in a reduced silicidation rate, since correspondingly activated impurities may act as diffusion "traps," thereby significantly slowing down or preventing the formation of metal silicide in the vicinity of these activated impurities. According to illustrative embodiments of the present invention, silicon contaminations and other impurities incorporated in exposed surface portions may be removed more efficiently by performing an oxidizing process after any surface activation by particle bombardment. In other illustrative embodiments, additionally or alternatively, a surface activation by particle bombardment may be performed in such a manner that a significantly reduced amount of silicon contaminations are created, or in some embodiments, a particle bombardment of exposed silicon surfaces may be avoided. Thus, a reactive process for pretreating a silicon-containing surface portion prior to receiving a metal silicide according to the present invention avoids a sputter etch process immediately prior to the metal deposition, but instead provides increased flexibility to perform, in one illustrative embodiment, a wet chemical treatment immediately prior to the metal deposition to significantly reduce the influence of particle bombardment on the finally obtained metal silicide regions.

In this respect, a "reactive" treatment or pretreatment of an exposed surface portion is to be considered as a process that chemically interacts with the material of the surface, for instance by forming Si—H bonds and the like, while processes such as rinsing the surface with deionized water may be considered as non-reactive treatments. Similarly, in any processes in which particles penetrate the surface portion and interact with the materials, for example by absorbing the penetrating particle, sputtering off atoms and molecules of a surface material and the like, may also be considered as "reactive" processes conversely to rinsing, drying and other post-treatment processes using substances and components consisting of particles that do not tend to chemically react with the underlying material and that have an averaged particle velocity or kinetic energy, which is well below a level that would be required for penetration of the underlying material and/or liberation of atoms therefrom.

It should be appreciated that the present invention is advantageous when applied to highly scaled semiconductor devices including MOS transistors having a gate length of 100 nm and less, or even 50 nm and less, since here an extremely low defect rate and high uniformity of the corresponding metal silicide regions is required. However, unless otherwise referred to in the specification and the appended claims, the principles of the present invention may also be readily applied to less critical semiconductor devices, thereby also significantly improving reliability and performance.

Figure 2A:
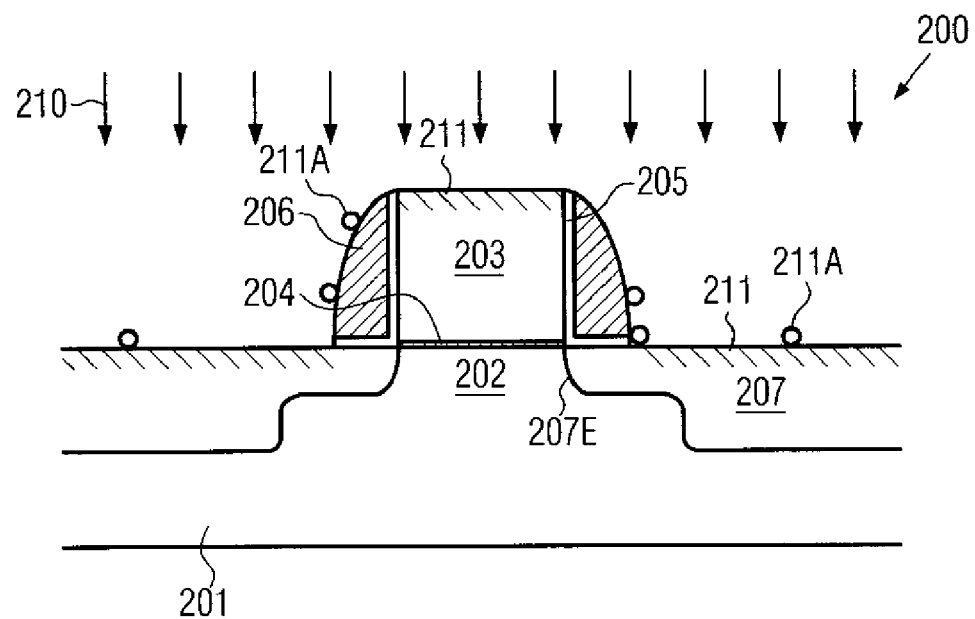
FIGS. 2a-2e schematically show cross-sectional views of a semiconductor device during the formation of a metal silicide in a silicon-containing conductive region according to illustrative embodiments of the present invention.

With reference to FIGS. 2a-2e and 3a-3c, further illustrative embodiments of the present invention will now be described in more detail. FIG. 2a schematically shows a semiconductor device 200, which, in one illustrative embodiment, represents a field effect transistor having a design dimension for the corresponding gate length of 100 nm and less. The semiconductor device 200 may comprise a substrate 201, which may represent a bulk silicon substrate, an SOI substrate, any other insulating carrier material having formed thereon a silicon-containing crystalline semiconductor layer and the like. It should be appreciated in this respect that a silicon-containing conductive region or layer is to be understood as a region or layer comprising a significant amount of silicon so as to allow the formation of a metal silicide in the corresponding conductive silicon-containing layer or region. For example, in some applications, the provision of a compound semiconductor, such as silicon/germanium, silicon/carbon and the like, may be contemplated with respect to enhancing charge carrier mobility, band gap engineering and the like. In this case, however, a significant amount of silicon, that is, more than approximately 50 atomic percent, may be provided which may be sufficient to create a desired amount of metal silicide during a silicidation process.

The semiconductor device 200 may further comprise a gate electrode 203, which may be comprised of a conductive silicon-containing material, such as polysilicon, doped polysilicon, silicon/germanium, silicon/carbon and the like. The gate electrode 203 is separated from a channel region 202 by a gate insulation layer 204, wherein the same criteria as previously outlined with respect to the gate insulation 104 in view of dimension, material composition and the like may also apply for the gate insulation layer 204. Furthermore, the channel region 202 may be formed within any appropriate silicon-containing crystalline layer or region, which is for convenience shown to be a part of the substrate 201. The channel region 202 is laterally bordered by respective extension regions 207e and corresponding drain and source regions 207 similarly as is explained with reference to the semiconductor device 100 shown in FIG. 1a. Furthermore, a spacer structure 206 including appropriate liners or etch stop layers 205 is provided at sidewalls of the gate electrode 203, wherein at this stage of manufacturing contaminations 211a, such as silicon contaminations, may be present on exposed portions of the spacers 206 and also on exposed portions of the drain and source regions 207 and the gate electrode 203, as well as in other device regions, such as isolation structures, which are not shown in FIG. 2a. Moreover, activated surface portions 211 are formed within the drain and source regions 207 and within the gate electrode 203.

A typical process flow for forming the semiconductor device 200 as shown in FIG. 2a may comprise the following processes. After patterning the gate electrode 203 and the gate insulation layer 204 by well-established processes preceded by corresponding formation implantation sequences, as are also described with reference to FIG. 1a, the drain and source regions 207 including the extension regions 207e may be formed by well-established techniques, for instance based on the process sequence as described with reference to FIG. 1a. Hereby, as previously explained with respect to the spacers 106, the spacers 206 may be formed intermittently so as to provide a required implantation mask for laterally shaping the dopant profile of the drain and source regions 207 and the extension regions 207e. After any high temperature processes for activating implanted dopants and curing implantation-induced damage, the device 200 may be subjected to a pretreatment preparing the device 200 for a subsequent silicidation process. In one illustrative embodiment, the pretreatment may be comprised of a plurality of individual processes, wherein the process 210 represents an activation and cleaning process on the basis of a particle bombardment, thereby creating the activated surface portions 211. In one illustrative embodiment, the treatment 210, which may be considered as a reactive treatment in the above-defined sense, may represent a sputter etch process, which may be performed in a corresponding ambient established in a sputter deposition tool in accordance with well-established process recipes so that substantially no metal is deposited during the treatment 210. That is, during the treatment 210, ions and atoms of an inert species, i.e., of a species such as argon, that may not unduly affect the electrical characteristics of the exposed portions 211, may be directed at the surface of the device 200, thereby sputtering off unwanted residues as is also the case in the conventional sputter etch process performed immediately before the actual metal deposition. In other illustrative embodiments, the particle bombardment of the treatment 210 may be established on the basis of any other appropriate plasma ambient, in which appropriate ions, which may include inert and reactive species, are accelerated to the exposed surface of the device 200, thereby forming the activated portions 211, possibly in combination with a chemical reaction with surface contaminations and other residues of preceding processes. For this purpose, any appropriate plasma etch and plasma deposition tool may be used that is able to establish an appropriate plasma ambient for generating the desired particle bombardment.

As previously discussed, the activation of the portions 211 by the particle bombardment 210 may result in the creation of silicon contaminations in undesired device locations, and may also lead to the activation of undesired surface contaminations 211a within the respective portions 211. It is believed that these contaminations 211a may significantly affect the silicidation process, as is previously described. Therefore, in illustrative embodiments of the present invention, the pretreatment preceding the actual silicidation process, that is, the metal deposition and the subsequent chemical reaction, may comprise further processes for modifying the contaminations 211a and surface areas of the portions 211.

Figure 2B:
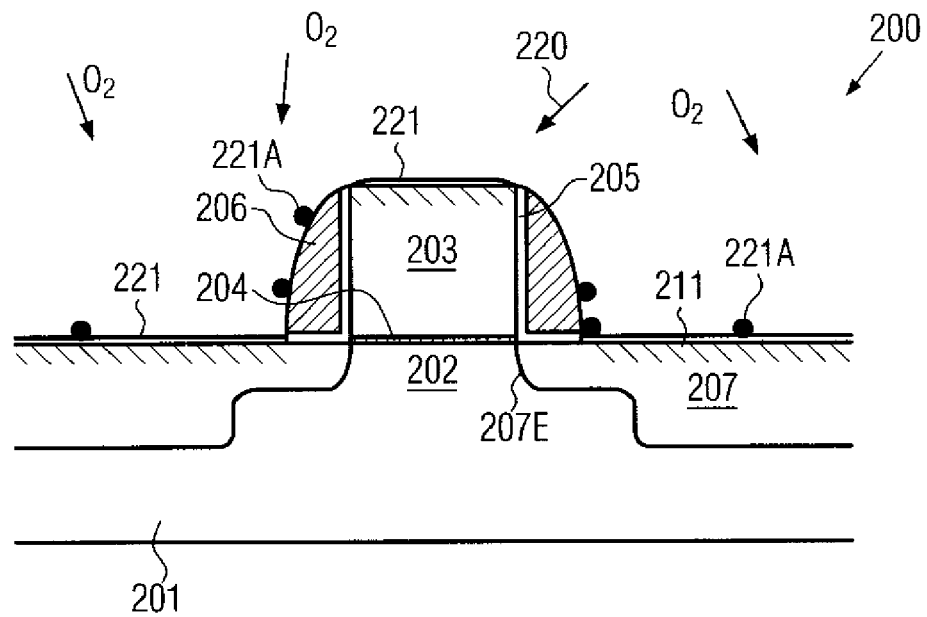

FIG. 2b schematically shows the semiconductor device 200 during a corresponding pretreatment process 220 for converting the contaminations 211a into a modified version 221a and also for forming respective modified surface areas 221 within the activated portions 211. In one particular embodiment, the treatment 220 represents an oxidation process performed at elevated temperatures in the range of approximately 200-1000° C. in an oxidizing ambient including oxygen, wherein further process parameters, such as the flow rate of additional carrier gases, the pressure and the duration of the oxidation process 220, may be adjusted in accordance with well-established recipes, since the formation of silicon dioxide is well-established in the art. In some embodiments, the oxidizing ambient of the treatment may be established as a plasma ambient including oxygen, wherein the oxidation depth may be controlled on the basis of the plasma parameters, such as excitation power, pressure, oxygen flow rate and the like. In other embodiments, a furnace process may be used to establish an oxidizing ambient of the treatment 220. In still other embodiments, the treatment 220 may comprise a wet chemical oxidation, for instance on the basis of deionized water that contains ozone, wherein the oxide may be subsequently removed on the basis of a wet chemical removal process, for instance by using HF, as will be described in more detail later on.

Furthermore, specific process parameters for the oxidation process 220 may be established on the basis of test runs with semiconductor structures having exposed silicon-containing surface portions, which have experienced substantially the same process history compared to the drain and source regions 207 and/or the gate electrode 203. For example, the oxidation process 220 may be adjusted so as to form the oxidized surface portions 221 with a thickness of several nanometers, for instance approximately 3-10 nm, wherein, however, the thickness of the portions 221 in the drain and source regions 207 may be different from the thickness of the region 221 formed in the gate electrode 203 due to a different diffusion behavior of oxygen in polycrystalline silicon and substantially crystalline silicon. In other illustrative embodiments, the thickness of the oxidized portions 221 may be selected to be greater than 10 nm, wherein a corresponding material loss after the removal of the oxide may be taken into account during the design of the semiconductor device 200 in order to not unduly compromise the source and drain regions 207 or the gate electrode 203. Moreover, the thickness of the oxidized portions 221, that is, the process parameters of the oxidation process 220, may be selected on the basis of experiments such that the silicon-based contaminations 221a (FIG. 2a) may be oxidized to an extent that allows removal of at least a significant portion of these oxidized contaminations 221a in a subsequent removal process. Appropriate process parameters for oxidizing the silicon-based contaminations 221a to a required degree may be determined on the basis of defect measurements performed after the oxidation process 220 in a subsequent oxide removal process with varying process parameters for the process 220.

Figure 2C:
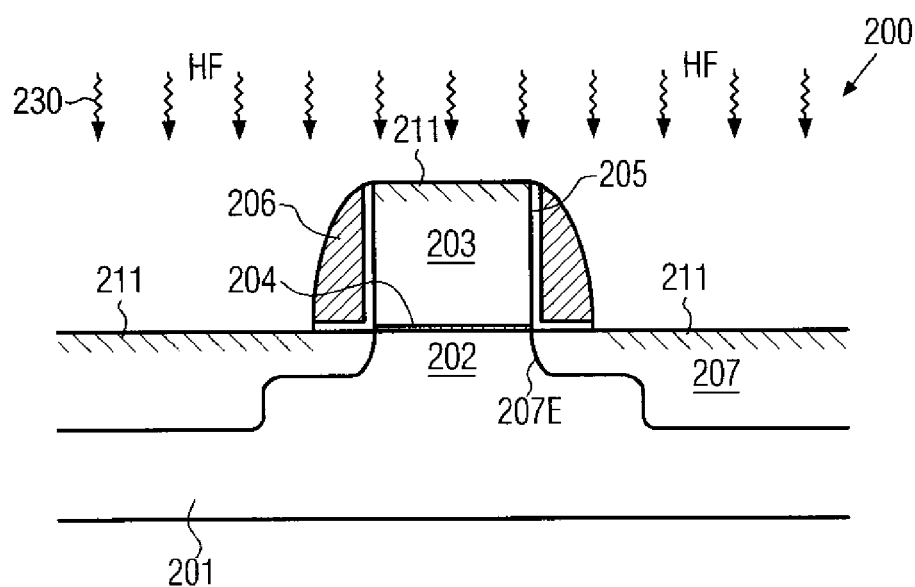

FIG. 2c schematically shows the semiconductor device 200 during a further process 230 of the entire pretreatment preceding the actual silicidation reaction and the corresponding metal deposition. In one illustrative embodiment, the process 230 represents a wet chemical reactive process for efficiently removing the oxidized portions 221 as well as the oxidized contaminations 221a. For this purpose, a chemistry on the basis of hydrofluoric acid (HF) may be used in accordance with well-established process recipes, wherein, as previously explained, the process parameters may also be adjusted in such a manner that a desired degree of Si—H bonds is created in the exposed surface areas of the portions 211. In one illustrative embodiment, the wet chemical reactive process 230 is the last reactive process performed prior to the deposition of a metal on the semiconductor device 200. In this case, the semiconductor device 200 may be maintained in an inert atmosphere after the completion of the process 230 and may then be inserted into any appropriate deposition tool, such as a sputter deposition tool, a CVD tool, an electrochemical deposition tool and the like, so as to form a layer of refractory metal, such as nickel, cobalt and the like. It should be appreciated that, after the completion of the process 230, in the illustrative embodiments comprising the process 230 as the last reactive process, further processes such as rinsing, drying and the like may be performed, wherein, however, a chemical and/or evasive treatment of the exposed surface portions 211 is substantially avoided. In other illustrative embodiments, the process 230 may be followed by one or more other reactive processes, wherein these further processes are, however, designed so as to avoid a particle bombardment resulting in the sputtering off of silicon from the exposed portions 211. For example, further wet chemical treatments on the basis of other chemicals may be performed after the oxide removal by means of the process 230.

Figure 2D:
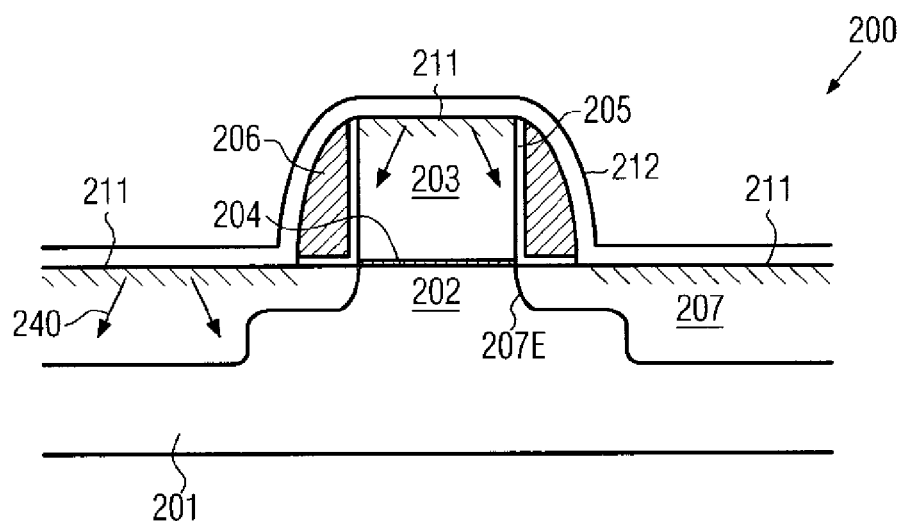

FIG. 2d schematically shows the semiconductor device 200 after the deposition of an appropriate metal layer 212, comprising, for instance, nickel, cobalt and the like. Contrary to the conventional process flow, the deposition of the metal layer 212 is not immediately preceded by a sputter etch or sputter clean process, thereby significantly reducing any deleterious influence of a particle bombardment on a subsequent metal silicide formation. Thereafter, the semiconductor device 200 is subjected to a heat treatment to initiate the metal diffusion into the activated portions 211 similarly as is described with reference to FIG. 1c. That is, an appropriate sequence of heat treatments or an individual heat treatment may be performed, depending on the metal used, the device and process requirements and the like, so as to create metal silicide regions. Due to the preceding pretreatment including the processes 210 (FIG. 2a), 220 (FIG. 2b) and 230 (FIG. 2c), a degree of silicide formation on the insulating portions, such as the sidewall spacers 206, is significantly reduced and the chemical reaction during the silicidation within the drain and source regions 207 and the gate electrode 203 may progress more uniformly, thereby significantly reducing the creation of any "missing silicide" defects, such as the defect 114a discussed with reference to FIG. 1d.

Figure 2E:
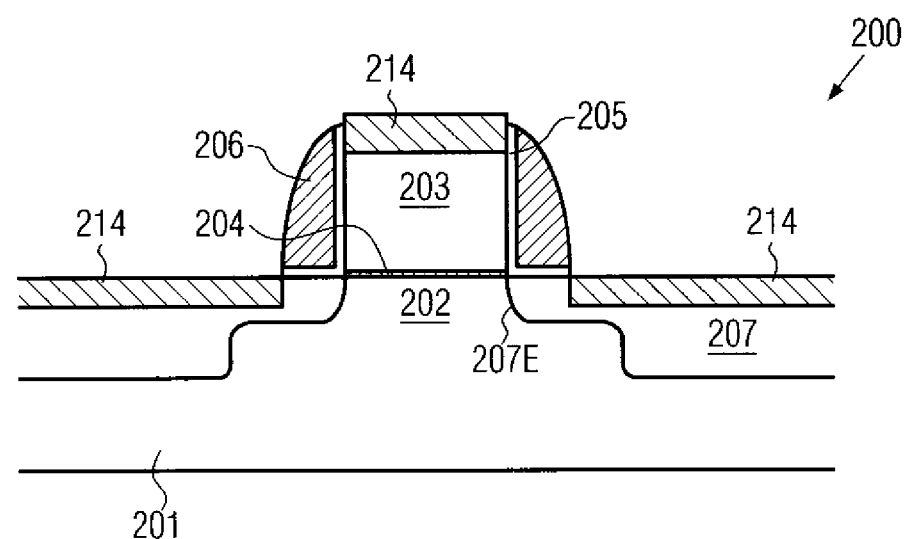

FIG. 2e schematically shows the semiconductor device 200 after the completion of the silicidation process 240. That is, the semiconductor device 200 is shown after a corresponding heat treatment with the final or intermediate removal of any non-reacted metal of the layer 212 and with an optional thermal process for stabilizing the created metal silicide, such as cobalt disilicide, nickel monosilicide and the like. Thus, the semiconductor device 200 comprises corresponding metal silicide regions 214 within the drain and source regions 207 and also includes a corresponding metal silicide region 214 in the gate electrode 203. It should be appreciated that, although the formation of the regions 214 in the drain and source regions 207 and within the gate electrode 203 is described as a common silicidation process 240, in other illustrative embodiments, the process for forming the region 214 in the gate electrodes 203 may be substantially decoupled from the process for forming the regions 214 in the drain and source regions 207. To this end, for instance, the gate electrode 203 may remain covered by a protective layer (not shown) during the formation of the device 200, while the drain and source regions may receive substantially the same pretreatment, i.e., the processes 210, 220, 230, and may be subjected to the silicidation process 240 as described above. Thereafter, the protective layer capping the gate electrode 203 may be removed and a pretreatment similar to the above-described treatment may be performed to prepare the gate electrode 203 to receive a different metal silicide. For instance, a nickel silicide may be formed in the gate electrode 203, as nickel silicide is preferably processed at a lower temperature compared to cobalt silicide, thereby substantially preventing a further modification of the cobalt silicide regions 214 already formed in the drain and source regions 207. However, any other silicidation regime may be used to form a desired metal silicide comprising one or more metals within the gate electrode 203 and the drain and source regions 207, while a reduced defect rate and an increased silicide uniformity may still be achieved by applying the principles of the present invention.

Figure 3A:
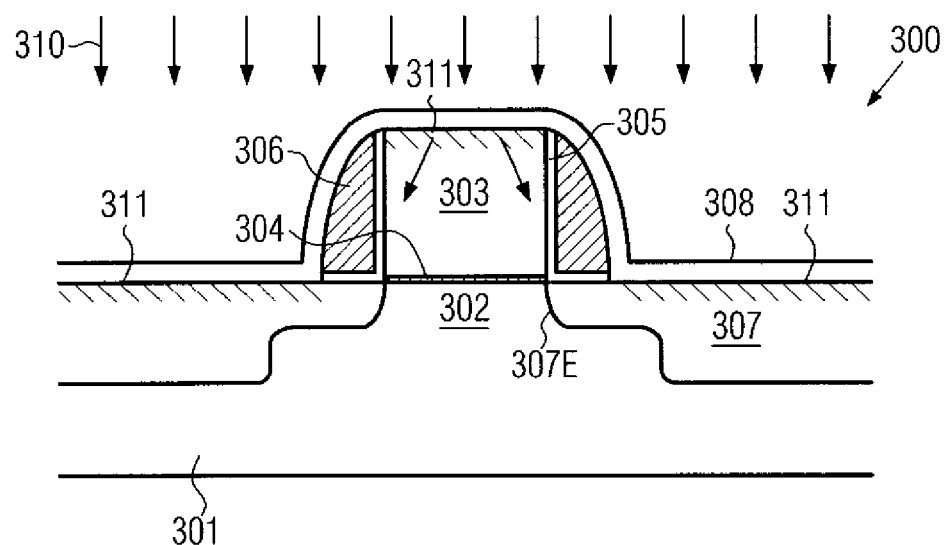
FIGS. 3a-3c schematically illustrate cross-sectional views of a semiconductor device during a process sequence for preparing the device for forming a metal silicide region thereon in accordance with other illustrative embodiments of the present invention.
Figure 3B:
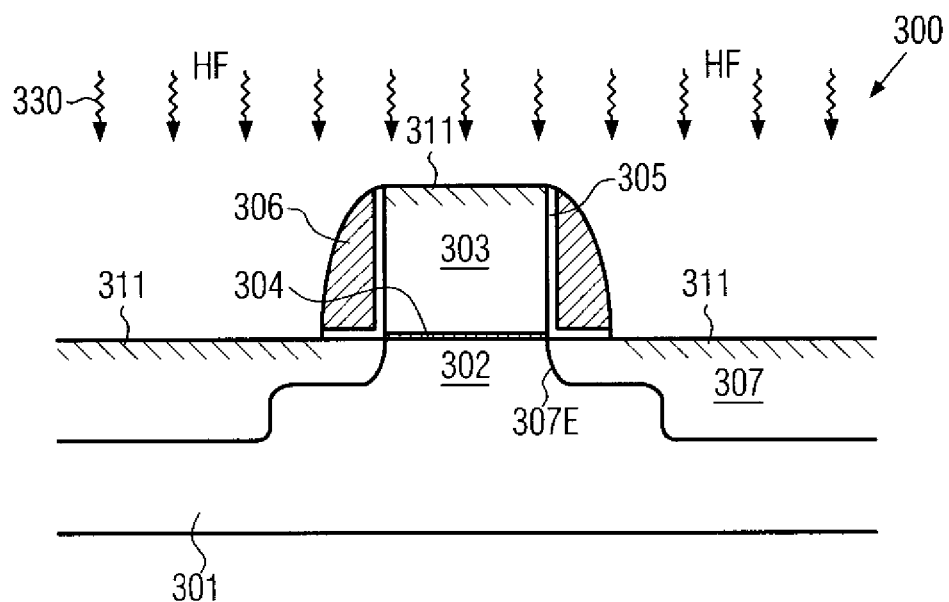
Figure 3C:
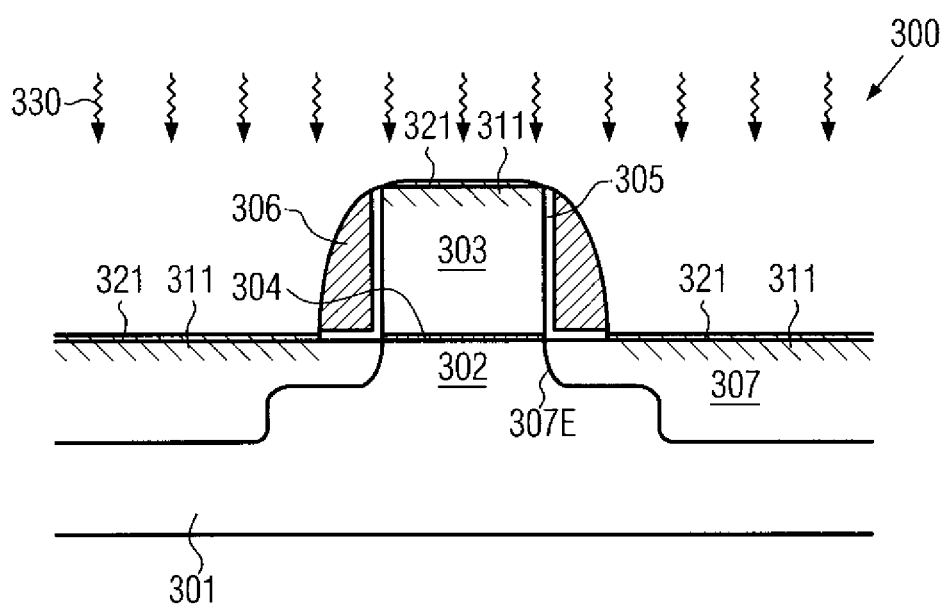

With reference to FIGS. 3a-3c, further illustrative embodiments of the present invention will now be described in more detail. In FIG. 3a, a semiconductor device 300 may comprise a substrate 301, source and drain regions 307 including respective extension regions 307e, a channel region 302 and a gate electrode structure including a gate electrode 303, gate insulation layer 304 and spacers and etch stop layers 306 and 305. Regarding the individual components, as well as the fabrication thereof, the same criteria apply as previously described with reference to the corresponding components of the semiconductor devices 100 and 200. Moreover, the semiconductor device 300 may comprise a protective layer 308 covering the gate electrode structure and the surface portions of the drain and source regions 307. The protective layer 308 may be comprised of any appropriate material, such as silicon dioxide, having a thickness in the range of approximately 5-50 nm. The protective layer 308 may protect the device 300 during the handling and processing of the device prior to a silicidation pretreatment.

In one illustrative embodiment, the device 300 is subjected to a first process of a silicidation pretreatment 310, in which a particle bombardment is initiated, thereby creating activated portions 311 in the drain and source regions 307 and the gate electrode 303. The treatment 310 may be designed such that the protective layer 308 is also attacked by the particle bombardment, thereby continuously removing the protective layer 308. For example, the treatment 310 may be designed as a highly anisotropic etch process, which is substantially based on a physical component of the impinging particles, wherein a chemical component is significantly less. Thus, with a continuously decreasing layer thickness of the protective layer 308, a corresponding activation of the portions 311 may be achieved. To this end, a high amount of inert species, such as argon, helium and the like, may be used during the treatment 310 to avoid undue modification of the electrical behavior of the portions 311. In still other embodiments, the process parameters of the treatment 310 may be changed to initially result in a high etch selectivity with a reduced physical component, while at a final stage a high degree of penetration and thus activation of the portions 311 may be accomplished. In still other embodiments, in the treatment 310 including a significant physical component, a high degree of particle bombardment may be maintained as long as the protective layer 308 is not completely removed, thereby substantially avoiding the sputtering off of silicon onto unwanted device portions.

FIG. 3b schematically shows the semiconductor device 300 in an advanced stage of the pretreatment prior to the actual silicidation process. In this stage, a further treatment 330 may be performed on the basis of a wet chemical process recipe, wherein any residuals of the preceding process 310 may be efficiently removed without undue surface penetration. In one illustrative embodiment, the treatment 330 may be performed on the basis of hydrofluoric acid (HF) so as to efficiently remove silicon dioxide when the protective layer 308 is substantially comprised of silicon dioxide. By treating the device 300 with HF, the desired Si—H bonds may be created on the exposed portions 311, thereby preparing the device 300 for the subsequent actual silicidation process. Hence, the device 300 as shown in FIG. 3b may be immediately subjected to any appropriate metal deposition process as is also described with reference to FIG. 2c. It should be appreciated that the treatment 330 may, in one illustrative embodiment, also represent the last reactive process step of the entire silicidation pretreatment prior to the actual metal deposition and the subsequent heat treatment. In other embodiments, further process steps may be performed after the treatment 330, however without using any particle bombardment so as to substantially avoid the creation of silicon contaminations as is described above.

Moreover, again referring to FIG. 3a, the treatment 310 may be performed substantially without any particle bombardment so as to remove the protective layer 308 on the basis of a wet chemical etch process, such as a process including HF, if the protective layer 308 is formed of silicon dioxide, or any other appropriate selective etch chemistry when the protective layer 308 is formed of a different material, such as silicon nitride and the like. After the removal of the protective layer 308, the further processing may be continued as is also described with reference to FIGS. 2a-2e, that is, an activation process such as the process 210 (FIG. 2a) may be performed to create the portions 311. In still other illustrative embodiments, after the wet chemical removal of the protective layer 308, any other processes without a substantial particle bombardment may be performed, such as the process 330, and then the metal deposition may be performed as is described above with reference to FIG. 3b. In still a further illustrative embodiment, the protective layer 308 may be comprised of silicon dioxide and the layer may be removed during the process 330 on the basis of HF, thereby substantially avoiding the creation of silicon contaminants while still forming Si—H bonds at the exposed portions 311.

FIG. 3c schematically illustrates the semiconductor device 300 in accordance with yet another illustrative embodiment, in which, after the removal of the protective layer 308 (FIG. 3a), an oxidation process may be performed, similarly as is described with reference to FIG. 2b, thereby creating oxidized portions 321. In this case, since the creation of silicon contaminations, conventionally caused by silicon sputtered off from exposed silicon portions, is already significantly reduced as is explained above with reference to FIGS. 3a and 3b, any other surface contaminations in the portions 311 of the gate electrode 303 and the regions 307 may be efficiently oxidized and may be incorporated into the oxidized portions 321. Thereafter, the process 330 may be performed on the basis of HF, thereby efficiently removing the oxidized portions 321, which may contain any oxidized impurities and surface contaminations, while simultaneously providing the desired Si—H bonds in the exposed portions 311. Thereafter, the manufacturing sequence may immediately advance to the deposition of an appropriate metal or may advance with further non-reactive or reactive treatments, however without any particle bombardment so as to avoid the creation of additional silicon contaminations.

As a result, the present invention provides an enhanced technique for the formation of metal silicide regions with a reduced defect rate and an improved metal silicide uniformity. To this end, the influence of a particle bombardment during the cleaning and activation of exposed silicon portions is significantly reduced or substantially completely avoided, while nevertheless a desired formation of Si—H bonds may be accomplished. In particular embodiments, any silicon contaminations and/or surface contaminations may be efficiently removed by performing an oxidation process followed by an HF-based removal process, wherein, in some cases, the metal deposition may be directly performed after the wet chemical removal process. In other embodiments, the effect of a particle bombardment with respect to silicon sputtering may be significantly reduced or avoided by maintaining a protective layer during the bombardment or by completely avoiding a sputter process during the silicidation pretreatment.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    treating a surface region of a semiconductor structure including a conductive silicon-containing surface portion by a particle bombardment;
    exposing said treated surface region to an oxidizing ambient to thereby form oxidized portions on said treated surface region;
    removing said oxidized portions formed on said treated surface region;
    after removing said oxidized portions, forming a metal layer on said surface region; and
    initiating formation of a metal silicide in said conductive silicon-containing surface portion.

2. The method of claim 1, wherein treating said surface region of the semiconductor structure comprises treating said surface region in a sputter deposition ambient substantially without depositing a metal.

3. The method of claim 1, wherein treating said surface region of the semiconductor structure comprises exposing said surface region to a plasma ambient comprising an inert ion species.

4. The method of claim 1, wherein said surface region remains substantially untreated after removing said oxidized portions and prior to forming said metal layer.

5. The method of claim 1, wherein said metal layer comprises a refractory metal.

6. The method of claim 1, wherein said conductive silicon-containing surface portion represents a surface region of at least one of a drain region, a source region and a gate electrode of a field effect transistor.

7. The method of claim 1, wherein removing said oxidized portions comprises performing a wet chemical etch process.

8. The method of claim 7, wherein said wet chemical etch process is based on hydrofluoric acid (HF).

9. The method of claim 1, further comprising forming a protective layer on said surface region prior to treating said surface region by particle bombardment.

10. The method of claim 9, wherein said protective layer is comprised of silicon dioxide.

11. The method of claim 9, further comprising removing said protective layer prior to treating said surface region by particle bombardment.

12. A method, comprising:
    performing a silicidation pretreating process for cleaning or activating a silicon-containing region of at least one of a gate electrode, a source region and a drain region, the pretreating process including:
        treating said silicon-containing region by particle bombardment on the basis of at least one inert ion species;
        exposing said silicon-containing region to an oxidizing ambient after treating said silicon-containing region by particle bombardment to thereby form oxidized portions and removing said oxidized portions during said wet chemical treatment; and
        performing a wet chemical treatment to remove said oxidized portions as a last reactive process prior to a silicidation process;
    depositing a metal layer on said pretreated silicon-containing region; and
    forming metal silicide in said silicon-containing region on the basis of said metal layer.

13. The method of claim 12, wherein said wet chemical treatment is an etch process on the basis of hydrofluoric acid (HF).

14. The method of claim 12, wherein said particle bombardment is performed in a sputter deposition ambient substantially without depositing material.

15. The method of claim 12, further comprising forming a protective layer above said silicon-containing region prior to performing said silicidation pretreatment process so as to reduce contamination during handling and transport of a substrate bearing said silicon-containing region.

16. The method of claim 15, further comprising removing said protective layer prior to performing said silicidation pretreatment process.

17. The method of claim 16, wherein said protective layer is removed by a wet chemical etch process.

18. A method, comprising:
  performing a silicidation pretreating process for cleaning or activating a silicon-containing region of at least one of a gate electrode, a source region and a drain region, the pretreating process including:
    treating said silicon-containing region by particle bombardment in a sputter deposition ambient substantially without depositing material;
    exposing said silicon-containing region to an oxidizing ambient after treating said silicon-containing region by particle bombardment to thereby form oxidized portions and removing said oxidized portions during said wet chemical treatment; and
    performing a wet chemical treatment to remove said oxidized portions as a last reactive process prior to a silicidation process;
  depositing a metal layer on said pretreated silicon-containing region; and
  forming metal silicide in said silicon-containing region on the basis of said metal layer.

19. The method of claim 18, further comprising forming a protective layer above said silicon-containing region prior to performing said silicidation pretreatment process so as to reduce contamination during handling and transport of a substrate bearing said silicon-containing region.

20. The method of claim 19, further comprising removing said protective layer prior to performing said silicidation pretreatment process.

21. The method of claim 20, wherein said protective layer is removed by a wet chemical etch process.

* * * * *